United States Patent [19]

Fox

[11] Patent Number: 4,816,756

[45] Date of Patent: Mar. 28, 1989

[54] CIRCUIT AND METHOD FOR STATICALLY TESTING ROTATING RECTIFIERS IN BRUSHLESS ALTERNATORS

[75] Inventor: David A. Fox, Shawnee Township, Allen County, Ohio

[73] Assignee: Westinghouse Electric Corp., Pittsburgh, Pa.

[21] Appl. No.: 92,806

[22] Filed: Sep. 3, 1987

[51] Int. Cl.[4] .................. G01R 31/00; G01R 31/02
[52] U.S. Cl. .................. 324/158 D; 324/158 MG; 318/490; 318/696
[58] Field of Search ............ 324/158 D, 158 MG; 322/99; 310/68 R, 68 D; 340/645; 361/93, 20, 85, 86, 87; 318/490, 696

[56] References Cited

U.S. PATENT DOCUMENTS

| | | | |
|---|---|---|---|
| 3,210,603 | 10/1965 | Calfee et al. | 361/93 |
| 3,226,561 | 12/1965 | Taniai | 361/85 |
| 3,534,226 | 10/1970 | Hyvarinen et al. | 361/86 |
| 3,534,228 | 10/1970 | Hyvarinen et al. | 361/86 |
| 3,535,589 | 10/1970 | Bourgeault | 361/85 |
| 4,164,705 | 8/1979 | Whitney et al. | 324/158 MG X |
| 4,348,629 | 9/1982 | Sievers | 324/158 MG X |
| 4,471,308 | 9/1984 | Gable et al. | 324/158 MG X |

FOREIGN PATENT DOCUMENTS 55-16378  12/1980  Japan .................. 324/158 MG

Primary Examiner—Reinhard J. Eisenzopf
Assistant Examiner—Vinh P. Nguyen
Attorney, Agent, or Firm—R. P. Lenart

[57] ABSTRACT

Rectifiers mounted on the rotor of a brushless alternator are tested by applying an AC voltage to an exciter field winding of the brushless alternator. This applied voltage induces current in a rotor mounted exciter armature winding which is inductively coupled to the exciter field winding and produces current flow through the rectifiers. The magnitude of an even harmonic component of the exciter field winding current is measured and compared to a predetermined magnitude to obtain an indication of the operational status of at least one of the rectifiers. This comparison may be done manually or may be performed electronically in accordance with known techniques.

11 Claims, 5 Drawing Sheets

CIRCUIT AND METHOD FOR STATICALLY TESTING ROTATING RECTIFIERS IN BRUSHLESS ALTERNATORS

BACKGROUND OF THE INVENTION

This invention relates to the testing of semiconductor rectifiers and, more particularly, to the testing of such rectifiers which are mounted on the rotors of brushless alternating current generators.

Alternating current synchronous generators of the brushless type are supplied with field excitation from an alternating current exciter and a rotating rectifier assembly. In such generator systems, the main generator has armature windings on the stator and the field winding on the rotor. A main alternating current exciter is provided which has its field winding on the stator and its armature winding on a rotor which is carried on the same shaft as the rotor of the main generator, or is otherwise mounted for rotation with that rotor. A rotating rectifier assembly is mounted on the same shaft, for rotation with the generator and exciter rotors, and is electrically connected between the exciter armature winding and the generator field winding. The stationary exciter field winding is supplied with direct current excitation from any suitable source, which may be independent of the main generator, such as a pilot exciter. In this way, a generator system is provided which requires no commutator or slip rings, and no brushes or sliding contacts.

In a typical brushless alternator for use in aerospace applications, the rotor turns at several thousand revolutions per minute. DC current in the stationary exciter field winding produces a three phase AC output on the rotor that is rectified by diodes mounted on the rotating shaft. The rectified output is supplied to the rotating field winding which is used to produce a rotating field that is used to generate the main AC output of the machine. The environment on the rotor is extremely hostile to the rotating rectifiers, combining high temperatures with high vibration and very high acceleration forces due to rotation. Consequently, failures of the rectifiers can occur. The rotating rectifiers usually fail shorted. This causes the alternator excitation requirements to increase by about 100%. The increased current causes overheating of the exciter and ultimately complete failure of the windings.

Circuits have been developed to detect diode failures on operating alternators, as illustrated by U.S. Pat. Nos. 3,210,603 and 3,534,228. Those circuits detect the ripple current induced in the exciter field winding by the unbalanced conduction of the rectifier bridge. The induced ripple current is at the fundamental exciter frequency and has a magnitude proportional to the load on the machine. To test alternators with those circuits, the alternators must be mechanically connected to an external drive source, such as an aircraft engine or test stand. This makes such testing time consuming. It is therefore desirable to develop a circuit for testing these rectifiers statically, that is, without rotating the alternator rotor.

SUMMARY OF THE INVENTION

This invention encompasses a circuit and method for testing rotor rectifiers of a brushless alternator statically, without rotating the rotor of the machine. To perform the method of this invention, an AC voltage is applied to an exciter field winding of a brushless alternator having a plurality of rectifiers mounted on the rotor, with the rectifiers being electrically connected to an exciter armature winding that is inductively coupled to the exciter field winding. The magnitude of an even harmonic of the current in the exciter field winding is measured and is compared to a predetermined reference value to obtain an indication of the operational status of at least one of the rectifiers.

A circuit which performs the method of this invention includes an AC voltage source for applying an AC voltage to the exciter field winding of the brushless alternator. A measuring circuit measures the magnitude of an even harmonic of the current in the exciter field winding and the magnitude of the even harmonic current component is compared to a predetermined value to obtain an indication of the operational status of at least one of the rectifiers.

Since this invention performs the rectifier test when the rotor is stationary with respect to the alternator stator, there is no need to couple the alternator rotor to an external mechanical drive source so that the time required to test the rectifiers is significantly reduced from the time required with prior art techniques.

DESCRIPTION OF THE PREFERRED EMBODIMENT

Figure 1:
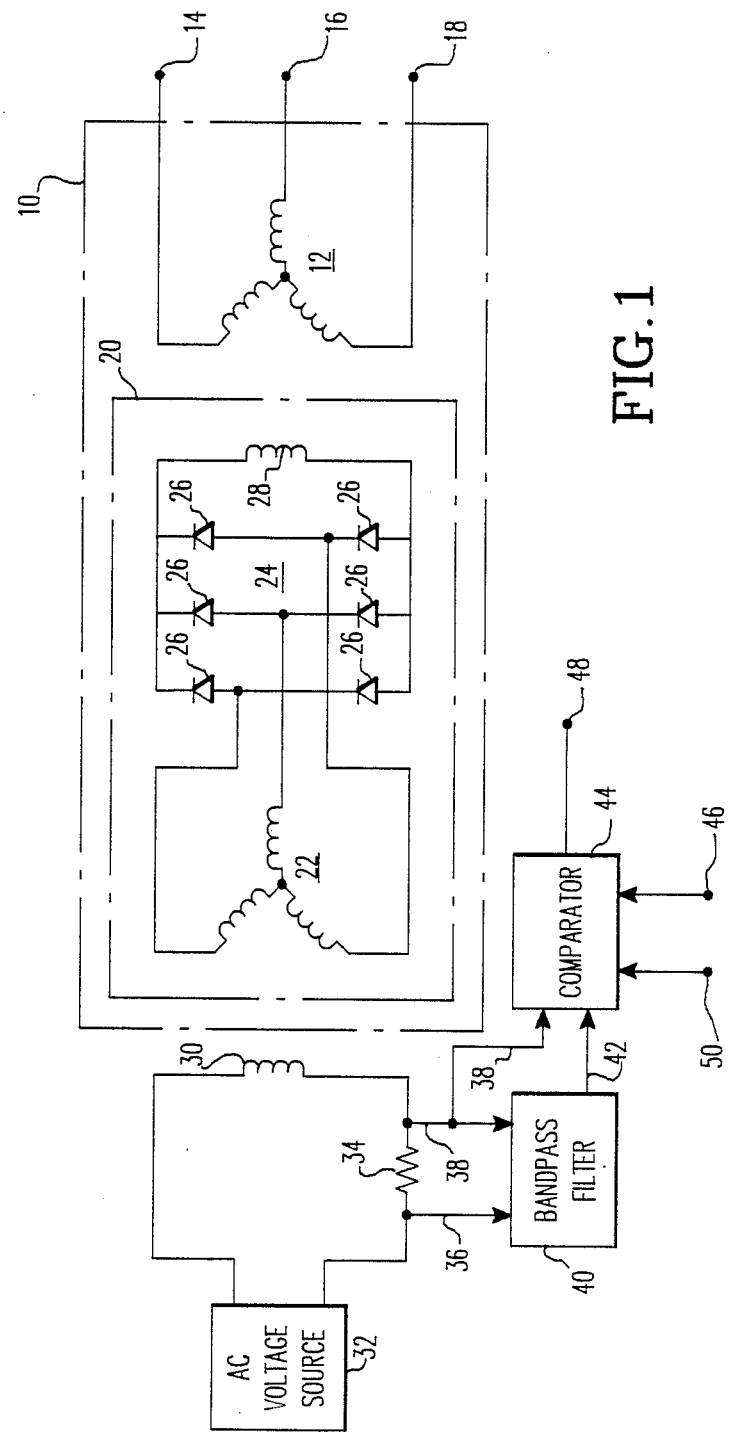
FIG. 1 is a schematic diagram of a synchronous brushless alternator and an associated test circuit constructed in accordance with one embodiment of the present invention.

Referring to the drawings, FIG. 1 is a schematic diagram of a synchronous, brushless alternator 10 and an associated rectifier test circuit. The brushless alternator includes a main armature winding 12 which is mounted on the stator and electrically connected to provide three phase output power to terminals 14, 16 and 18. A rotor 20 is mounted for rotation with respect to the stator and carries a three phase exciter armature winding 22. The output of the exciter armature winding is connected to a bridge configuration 24 of rectifiers 26 which supply rectified current to a main field winding 28. An exciter field winding 30 is mounted on the stator and inductively coupled to the exciter armature winding 22. In normal operation, the exciter field winding 30 is supplied with DC current. However, when conducting the tests of this invention, the exciter field winding is connected to an external AC voltage source 32. This voltage source must supply AC voltage of sufficient magnitude to overcome the forward voltage drop of the rectifiers in the bridge circuit on the rotor. The current into the exciter field winding 30 is sensed through the use of a shunt resistor 34 to produce a signal representative of that current on lines 36 and 38.

Normal diode conduction produces symmetrical, odd harmonics in the sensed current. A shorted rectifier, however, produces distorted currents which appear as even harmonics of the applied voltage frequency. For example, if the applied voltage is at 400 hertz, a component of 800 hertz can be detected in the current signal. A bandpass filter 40 is used to separate the even harmonic component and produce a signal representative of that component on line 42. That signal is compared by comparator 44 with a predetermined reference signal supplied on line 46 to obtain a signal which represents the operational status of the rotor rectifiers at 48. The magnitude of the total current signal can also be compared with a predetermined magnitude signal supplied at 50.

A suitable band pass filter can be used to separate out the even harmonic component from the fundamental current signal and other harmonics so that the level of the appropriate harmonic can be read on an AC volt meter and, with suitable switching circuits, the applied AC voltage and total current signals may be read as well.

Both the total exciter field coil current and filter outputs vary considerably as the rotor is slowly rotated, thereby changing the voltage applied to a shorted rectifier. It has been experimentally determined that the current increases by about 50% while the filter output changes by a factor of 15 with respect to their normal values. This feature is very distinctive for an alternator with a failed rectifier.

It should be noted that there is a unique electrical position of the rotor where the conduction through a shorted rectifier creates no even harmonics. However, this position is very sensitive and is equivalent to a null in a bridge circuit. Very slight changes in the rotor position will move it from the null. Therefore, it is unlikely that a failed rectifier will not be detected by the circuit of this invention.

Figure 2:
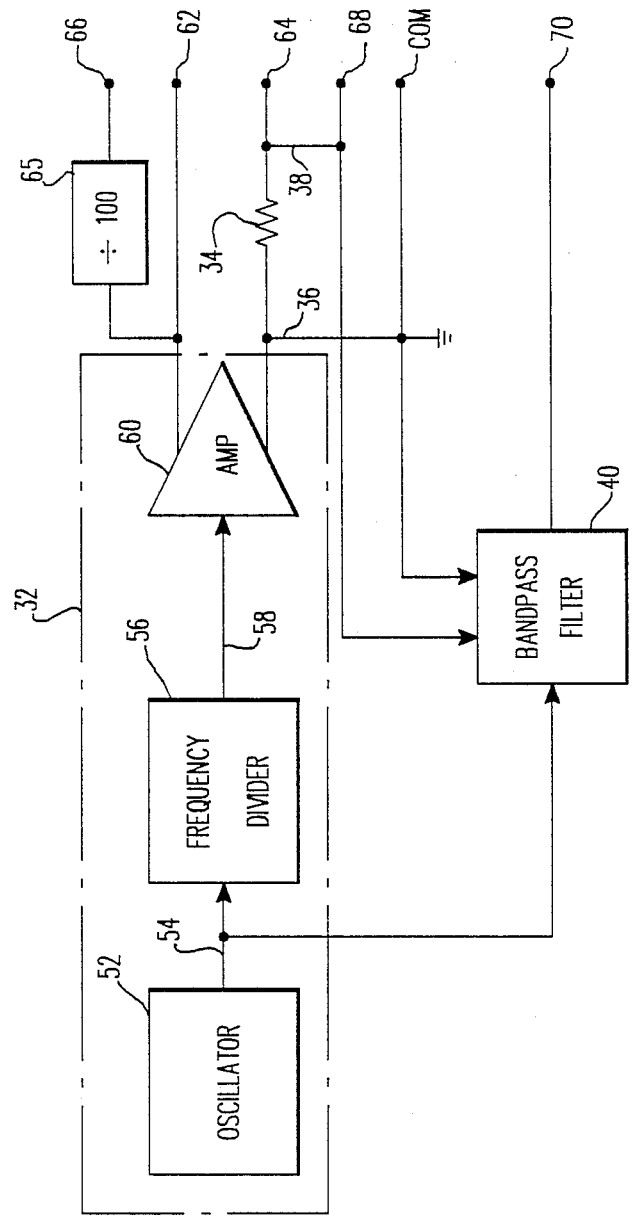
FIG. 2 is a block diagram of the test circuit of FIG. 1.

FIG. 2 is a block diagram of a specific embodiment of the test circuit of FIG. 1. An oscillator 52 is used to generate an 80 kilohertz clock signal on line 54. This clock signal is divided by a frequency divider 56 to provide a 400 hertz square wave via line 58 to amplifier 60. That square wave is amplified to produce the voltage for the exciter field winding at terminals 62 and 64. The exciter field winding current is sensed by the shunt resistor 34 and filtered by a switched capacitor filter that is clocked by the oscillator output and tuned to 800 hertz. The center frequency of the filter is controlled by the 800 hertz clock signal. The applied voltage (divided by 100 by divider 65), current signal and filter output are brought out to terminals 66, 68 and 70 respectively.

Figure 3A:
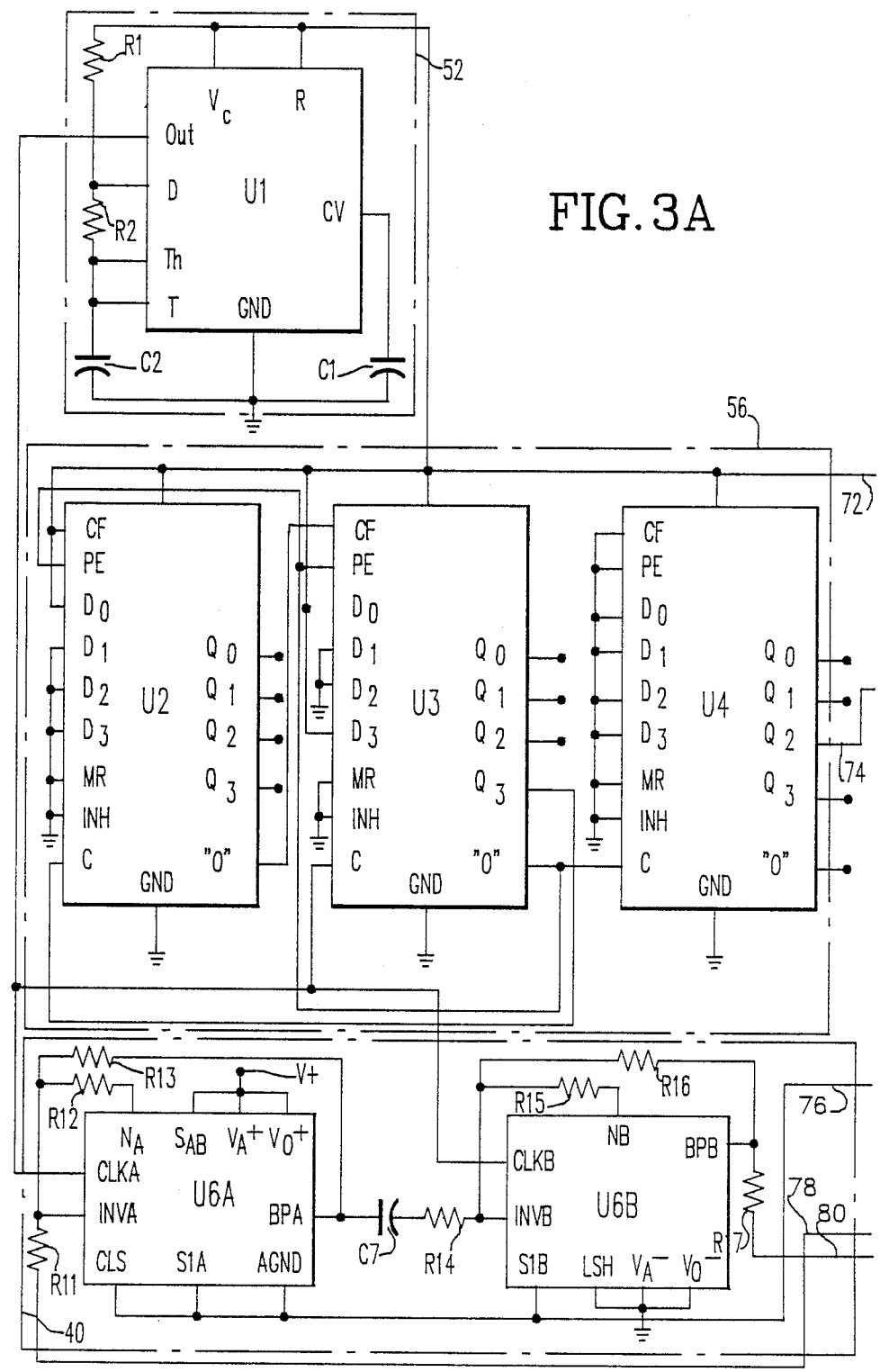
FIGS. 3A and 3B show a schematic diagram of the circuit of FIG. 2.
Figure 3B:
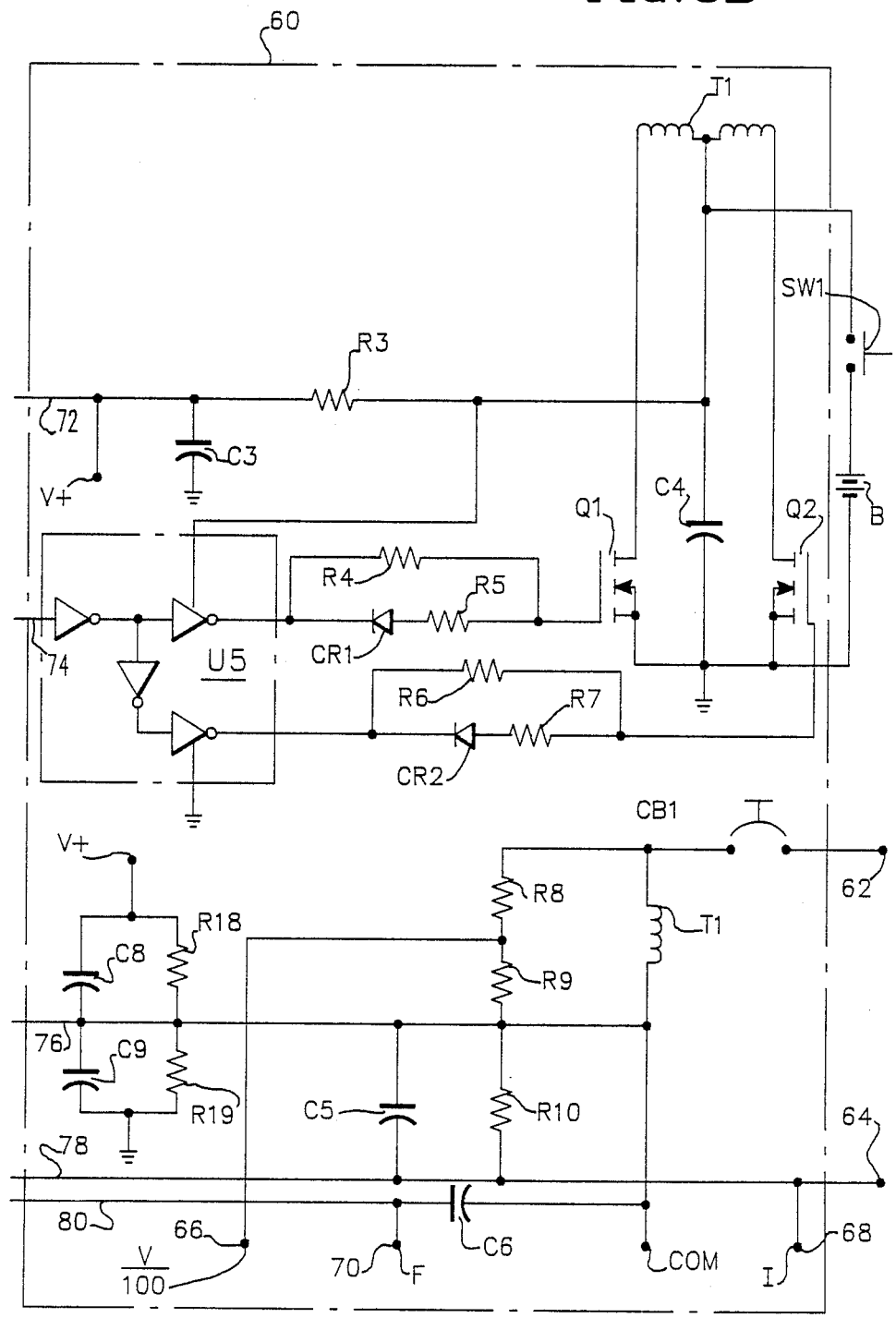

FIGS. 3A and 3B show a schematic diagram of the circuit of FIG. 2. Lines which connect FIGS. 3A and 3B are labeled as 72, 74, 76, 78 and 80 for clarity. The circuit is powered by a 12 volt battery B through a switch SW1. The voltage appearing at terminals 62 and 64 would be supplied to the exciter field winding.

In order to provide a more complete description of the circuit of FIGS. 3A and 3B, the components used to construct that circuit are listed in Table I.

TABLE I

| Component | Type/Value |
|---|---|
| U1 | 555 timer |
| U2,3,4 | MC14526 counter |
| U5 | MC14049 hex inverter |
| U6 | MF10CN switched capacitor filter |
| R1 | 3k 5% |
| R2 | 7.5k 5% |
| R3 | 100 ohms 5% |
| R4, 6 | 10K 5% |

TABLE I-continued

| Component | Type/Value |
|---|---|
| R5, 7 | 3.3k 5% |
| R8,13,16 | 100k 1% |
| R9 | 1k 1% |
| R10 | 1 ohm 1% |
| R11,12,14,15 | 10K 1% |
| R17,18,19 | 1k 5% |
| C1 | 2.2 μF |
| C2 | .001 μF |
| C3 | 150 μF |
| C4 | 180 μF |
| C5 | 20 μF |
| C6,7 | .01 μF |
| C8,9 | 1 μF |
| CR1,2 | 1N4148 |
| Q1,2 | MTM1225 |
| T1 | 115/12/12V,400 Hz |

Typical tests results for the circuit of FIGS. 3A and 3B are illustrated in Table II. Note that the readings for an alternator with one shorted rectifier vary from nearly normal to higher values, depending on rotor position. In Table II, V/100 represents one hundredth of the output voltage in volts appearing between terminals 62 and 64, I represents the total current in amperes delivered to the exciter field winding, and F represents the switched capacitor filter output on terminal 70 in volts.

TABLE II

Experimental Results Obtained with the Circuit of FIG. 3

| Condition | V/100 | I | F |
|---|---|---|---|
| Not connected | 1.20 | 0.00 | .011 |
| Good alternator | 1.10 | .077 | .015 |
| One shorted rectifier | .98–1.05* | .082–.120* | .015–.211* |
| Two shorted rectifiers | .95 | .095–.144* | .015–.020* |
| Shorted main field winding | 1.02 | .092 | .015 |

*These readings vary within this range as the rotor position is changed.

Figure 4:
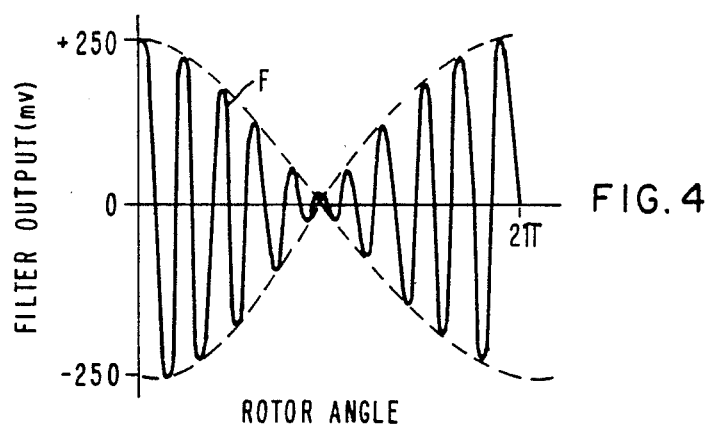
FIG. 4 is a plot of the output of the filter in the circuit of FIGS. 3A and 3B verses rotor angle.
Figure 5:
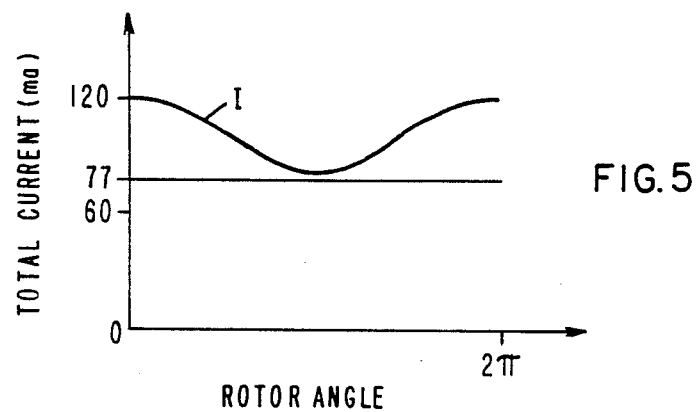
FIG. 5 is a plot of the total exciter field winding current versus rotor angle.

The parameter values illustrated in Table II were measured with an AC voltmeter. The output voltage declines somewhat as the circuit is loaded due to the characteristics of the battery used. FIGS. 4 and 5 illustrate how the filter output voltage and total exciter field winding current vary with rotor angle for an alternator having one shorted rectifier.

It should now be apparent that the circuit illustrated in the figures performs a method for testing rectifiers mounted on rotors of brushless alternators by applying an AC voltage to an exciter field winding of the brushless alternator and measuring the magnitude of an even harmonic component of current in the exciter field winding. The magnitude of the even harmonic current component is then compared to a predetermined value (corresponding to an alternator with known good rectifiers) to obtain an indication of the operational status of the rotor rectifiers. This comparison step may be performed by a comparator circuit in accordance with known technology or manually by comparing the harmonic component magnitude to the expected harmonic component magnitude for an alternator having properly functioning rectifiers.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A method for testing rectifiers mounted on rotors of brushless alternators comprising the steps of:
   applying an AC voltage to an exciter field winding of a brushless alternator having a plurality of rectifiers mounted on a rotor, said rectifiers being electrically connected to an exciter armature winding which is inductively coupled to said exciter field winding;
   measuring the magnitude of an even harmonic component of current in said exciter field winding; and
   comparing said magnitude to a first predetermined value to obtain an indication of the operational status of at least one of said rectifiers.

2. A method for testing rectifiers mounted on rotors of brushless alternators, as recited in claim 1, wherein:
   said even harmonic component is the second harmonic.

3. A method for testing rectifiers mounted on rotors of brushless alternators, as recited in claim 1, wherein:
   said rotor is stationary during said measuring step.

4. A method for testing rectifiers mounted on rotors of brushless alternators, as recited in claim 1, wherein the measuring step includes the steps of:
   producing a signal representative of said current; and
   filtering said signal to derive said harmonic component.

5. A method for testing rectifiers mounted on rotors of brushless alternators, as recited in claim 1, wherein:
   said AC voltage has sufficient magnitude to overcome the forward voltage drop of said rectifiers.

6. A method for testing rectifiers mounted on rotors of brushless alternators, as recited in claim 1, further comprising the steps of:
   measuring the total magnitude of said current; wherein said total magnitude of said current is defined as the fundamental plus all harmonic components, and
   comparing the total magnitude of said current to a second predetermined value to obtain an indication of the operational status of at least one of said rectifiers.

7. A circuit for testing rectifiers mounted on rotors of brushless alternators comprising:
   an AC voltage source for applying an AC voltage to an exciter field winding of a brushless alternator having a plurality of rectifiers mounted on a rotor, said rectifiers being electrically connected to an exciter armature winding which is inductively coupled to said exciter field winding;
   means for measuring the magnitude of an even harmonic component of current in said exciter field winding; and
   means for comparing said magnitude to a first preselected value to obtain an indication of the operational status of at least one of said rectifiers.

8. A circuit for testing rectifiers mounted on rotors of brushless alternators, as recited in claim 7, wherein:
   said even harmonic component is the second harmonic.

9. A circuit for testing rectifiers mounted on rotors of brushless alternators, as recited in claim 7 wherein said means for measuring includes:
   means for producing a signal representative of said current; and
   means for filtering said signal to derive said harmonic component.

10. A circuit for testing rectifiers mounted on rotors of brushless alternators, as recited in claim 7, wherein:
    said AC voltage has sufficient magnitude to overcome the forward voltage drop of said rectifiers.

11. A circuit for testing rectifiers mounted on rotors of brushless alternators, as recited in claim 7, further comprising:
    means for measuring the total magnitude of said current; wherein said total magnitude of said current is defined as the fundamental plus all harmonic components, and
    means for comparing the total magnitude of said current to a second predetermined value to obtain an indication of the operational status of at least one of said rectifiers.

* * * * *